(12) United States Patent
Atlas et al.

(10) Patent No.: US 7,078,670 B2
(45) Date of Patent: Jul. 18, 2006

(54) LOW NOISE CHARGE GAIN CIRCUIT AND CCD USING SAME

(75) Inventors: Gene Atlas, Irvine, CA (US); Mark Wadsworth, Glendora, CA (US); Richard H. Kullman, San Marcos, CA (US); Sarit Neter, Irvine, CA (US)

(73) Assignee: Imagerlabs, Inc., Monrovia, CA (US)

( * ) Notice: Subject to any disclaimer, the term of this patent is extended or adjusted under 35 U.S.C. 154(b) by 0 days.

(21) Appl. No.: 10/936,897

(22) Filed: Sep. 9, 2004

(65) Prior Publication Data

US 2005/0056771 A1    Mar. 17, 2005

Related U.S. Application Data

(60) Provisional application No. 60/503,181, filed on Sep. 15, 2003.

(51) Int. Cl.
*H01L 27/00* (2006.01)
*H01J 40/14* (2006.01)

(52) U.S. Cl. .............................. 250/208.1; 250/214.1; 348/308; 257/222

(58) Field of Classification Search ............. 250/208.1, 250/214 R, 214 A, 214.1; 348/308; 257/222, 257/225
See application file for complete search history.

(56) References Cited

U.S. PATENT DOCUMENTS

| 5,751,779 | A | * | 5/1998 | Weir | 377/60 |
| 2002/0027189 | A1 | * | 3/2002 | Murakami et al. | 250/208.1 |
| 2002/0100863 | A1 | * | 8/2002 | Spears | 250/208.1 |

\* cited by examiner

*Primary Examiner*—Stephone B. Allen
*Assistant Examiner*—Patrick J. Lee
(74) *Attorney, Agent, or Firm*—MacPherson Kwok Chen & Heid LLP; Tom Chen

(57) ABSTRACT

A charge coupled device (CCD) includes a low noise charge gain circuit that amplifies charge of a cell dependent upon the charge accumulated by the cell. The low noise charge gain circuit receives clocking signals, such as from an input diode, which allow charge to accumulate in a reservoir well and then flow into a receiving well. The low noise charge gain circuit also receives a voltage signal corresponding to charge accumulated on an associated cell. The amount of charge flowing into the receiving well depends on this voltage signal.

24 Claims, 10 Drawing Sheets

LOW NOISE CHARGE GAIN CIRCUIT AND CCD USING SAME

RELATED APPLICATIONS

The present application claims priority of U.S. Provisional App. Ser. No. 60/503,181, filed Sep. 15, 2003.

BACKGROUND

1. Field of the Invention

This invention relates to methods of manufacturing semiconductor devices, and more particularly to forming ultra shallow junctions in such devices.

2. Related Art

Charge Coupled Device (CCD) image sensors have been utilized in a variety of vision systems for a wide range of applications including highly demanding ones such as high sensitivity spectroscopy, high sensitivity chemical analysis and proteomics, high throughput drug screening, high throughput industrial inspection, high speed x-ray crystallography and any other high frame rate low light level applications. The most challenging applications are those that require high speed (also referred to as high frame-rate) in extreme low illumination levels. This type of imaging presents a set of difficulties not encountered in conventional applications such as digital still cameras or digital cinema. The photon-starved environment stresses all performance characteristics of the sensor at high frame rates. In order to accommodate the high frame rate, the pixel rate must increase, which consequently increases the noise bandwidth of the CCD output amplifier and thus leads to an increase in the readout noise of the sensor. This will result in reduction in the Signal-to-Noise-Ratio (SNR) of the device. Furthermore, as the frame rate increases, the integration time per frame decreases, causing additional degradation of the device SNR.

There are currently two technologies that address imaging applications of high speed in low light level, namely Image Intensifier (II) technology and Charge Multiplication CCD technology. Both technologies suffer from drawbacks that limit their SNR.

The Image Intensifier was originally developed for military use and dominated low light level imaging for decades. It has an input photocathode followed by a micro-channel plate electron multiplier and a phosphorescent output screen. The gain of the micro-channel plate is adjustable over a wide range, with a typical maximum of about 80,000 photons pulse from the phosphor screen per one photon input. The multiplied photons are then sensed by the CCD or CMOS imaging sensor. By amplifying each photoelectron by a gain as high as 100,000, the device essentially eliminates the readout noise of the CCD or CMOS imaging sensor.

However, the technique suffers from several drawbacks. For example, Image Intensifier devices suffer from increase in Fixed Pattern Noise (FPN) due to the non-uniformity of the photoelectron gain of the device across the entire imaging area. That causes reduction in SNR and increases device complexity for FPN correction functionality.

Further signal degradation is caused by the gain uncertainty for each interaction (referred to as electron multiplication noise) that manifests similarly to Shot Noise. This effect is characterized by the "noise factor" parameter (NF). A typical best case NF value is ~1.7. The NF has the equivalent effect of lowering the Quantum Efficiency (QE) of the device by the square of NF. Thus, an Image Intensifier device with a native QE of 45% and best NF of 1.7 will be reduced down to 15.571%.

An additional problem is the limited bandwidth of the spectral response of the Image Intensifier device, which limits sensitivity to the longer red wavelengths, UV, and deep blue, a characteristic that is often not ideal for a CCD and thus not desired.

Furthermore, an Image Intensifier device suffers from relatively low intra-frame dynamic range unless it encumbers extra device complexity. It is difficult to obtain more than a 256-fold intensity range from the Image Intensifier device. Dynamic range expansion can be achieved via a gated variable gain intensified CCD that results in a more complicated device.

A Charge Multiplication CCD device is a conventional CCD structure extended with an additional charge transfer control section that provides voltage level (e.g., 40 Volts) that is significantly higher than conventional levels (e.g., 10 Volts). Thus, electric fields in the semiconductor material are created that accelerate the charge carriers to sufficiently high velocities so that additional carriers are generated by impact ionization (also referred to as avalanche gain). The probability of charge multiplication per transfer is quite small (e.g., 1%) but with a large number of transfers, substantial electronic gains may be achieved. For mean gain per stage R and n number of transfers, the total gain $G=(1+R)^n$. The maximum gain per stage R is typically 0.015 as set by the onset of excess noise. If n is high enough, the effective output read noise is reduced to very low levels (e.g., $<1e^-$ rms) since the output amplifier electronic noise (e.g., 100 $e^-$ at 1 MHz pixel rate) is divided by the gain factor of the multiplication register.

However, though the charge multiplication CCD device offers much higher quantum efficiencies as compared to the Image Intensifier device, it suffers from several serious drawbacks.

One problem is the noise which is caused by the uncertainty in the actual gain and is the same as for the Image Intensifier device (referred to as noise factor NF=1.414 to 1.6). This noise appears similar to Shot Noise and degrades the SNR of the device.

Furthermore, the technique requires extra circuit complexity for a very fine control of the high amplitude clock pulse. This fine control is required since the multiplication gain is a very strong function of gate clock voltages such that any variation in the clock rails will have a serious effect on the Noise Factor of the device. For example, a typical gain needed for effective noise reduction is $G\approx100$, and a 1V error in the clock voltage will produce a 500% error in the gain.

In addition further complexity is required for overall system control due to the fact that the avalanche gain (i.e. impact ionization) is an exponential function of temperature, and thus has very strong temperature dependence. Hence, a small temperature variation can produce a large change in the register gain (e.g., a variation of ~1° C. produces a ~5% change), stressing the temperature control of the system.

Accordingly, it is desirable to have a CCD that can be used in high frame rate, low light level conditions without the disadvantages discussed above associated with CCDs or imaging sensors.

SUMMARY

In accordance with one aspect of the present invention, a charge coupled device (CCD) includes a low noise charge gain circuit that amplifies charge of a cell dependent upon the charge accumulated by the cell. The low noise charge gain circuit receives clocking signals, such as from an input diode, which allow charge to accumulate in a reservoir well and then flow into a receiving well. The low noise charge gain circuit also receives a voltage signal corresponding to charge accumulated on an associated cell. The amount of charge flowing into the receiving well depends on this voltage signal. Amplification can continue, if desired, in a subsequent receiving well or wells, and finally to a sensing node.

In one embodiment, a control gate is coupled to the clock signals, a reservoir gate is formed over the reservoir well, a receiving gate is formed over the receiving well, and a signal gate is formed between the reservoir and receiving wells. These gates control the accumulation and transfer of the appropriate charge within the wells. The gates and wells, as well as the CCD and/or the low noise charge gain circuit, may be formed as metal oxide semiconductors (MOS) such as NMOS (N-channel MOS) or PMOS (P-channel MOS). The CCD may use different timing schemes such as, but not limited to, two-phase, three-phase, or four-phase schemes. The CCD may utilize different transfer schemes such as, but not limited to, full frame (without additional storage area), frame-transfer (with additional storage area), interline-transfer (with line storages), or split-frame-transfer (multiple storage areas) schemes. Furthermore, the CCD may be, but not limited, of front-illumination or back-illumination type devices.

In one embodiment, the low noise charge gain circuit is a "fill and spill" circuit and includes means to modulate the voltage on a gate that acts as a "sluice gate." The sluice gate may be defined as a gate that controls the charge level that is left under the reservoir gate after charge is transferred, spilled, or flows to the signal channel. The gate may be, but is not limited to, polysilicon or metal on the CCD.

In one embodiment, the CCD uses direct detection and collection of the charged particles. The device may utilize a shift register for accumulating the charges from pixels in an image array. The signal charge may be clocked through the CCD to a single or multiple output amplifiers on the CCD itself or external to the CCD, such as a CMOS (Complementary MOS) device attached to the CCD, e.g. by bump bonds.

The present invention provides a low noise charge gain that is free of the multiplication gain noise which damages the effective QE of current Image Intensifier and Charge Multiplication CCD systems. The invention also provides methods to design systems that may be capable of sub-electron read noise (i.e., standard deviation of read noise less than 1) when operating in high frame rates (e.g., greater than 30 frames per second). The charge gain is also maximized, which reduces any subsequent noise contributions of downstream noise generators (e.g., CCD amplifiers, CMOS amplifiers) to insignificant values.

As it will be apparent from the accompanying drawings and the description that are set forth below, the amplification scheme of the current invention is not statistical in nature and hence does not suffer from increased shot-like noise as is the case with the conventional devices described previously.

In addition, the amplification techniques of the current invention are not sensitive to temperature changes nor is it sensitive to input clock offset or edges. As a result, they do not suffer from gain errors that decrease intra-frame dynamic range as is the problem with the conventional devices described earlier.

The amplification techniques of the current invention also have a much lower fixed pattern noise than the conventional devices described earlier since the gain variation depends on the number of output channels rather than on a pixel by pixel basis. This can be significant since a typical number of output channels is in the order of 1, 2, 4 and rarely higher than 16, while a typical number of pixels in an array is in the order of 16K (128×128), 1M (1024×1024), and higher.

Furthermore, the CCD diode spectral response of the present invention has much higher bandwidth with comparison to the spectral response of the conventional Image Intensifier device and thus does not suffer from lower sensitivity to longer red wavelengths, UV, or deep blue light.

A significant advantage of the present invention is that a correlated double sampling (CDS) function is incorporated into the charge gain circuit. This is in contrast to conventional circuits, in which an additional CDS circuit is added to receive the output of the CCD to eliminate reset from the signal. The CDS circuit measures the reset voltage level, saves it or stores it in memory, and then subtracts it from the signal voltage level to eliminate or reduce reset noise. By incorporating the CDS function in the charge gain circuit of the present invention, the ultra low noise characteristic of the CCD is preserved.

This invention will be more fully understood in light of the following detailed description taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
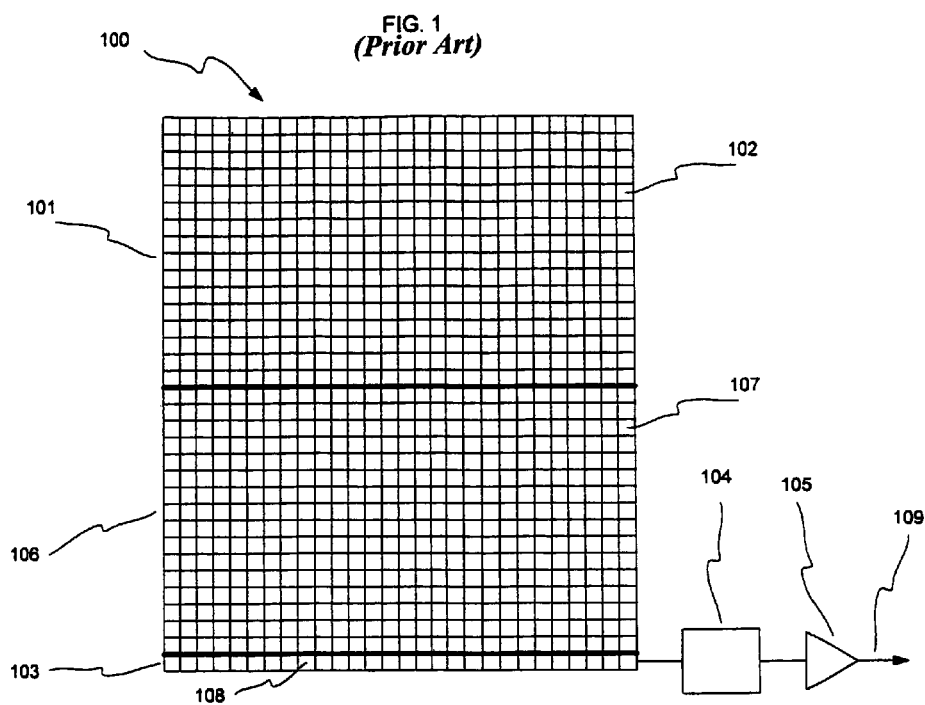
FIG. 1 is a block diagram of a conventional three-phase charge coupled device (CCD).

FIG. 1 is a block diagram of a conventional three-phase charge coupled device (CCD) 100. Note that in the three-phase CCD, each pixel requires three gates (one storage gate and two barrier gates) and three input clocks (one per gate), with three time phases required for a complete charge transfer from a pixel to the next one. The CCD 100 comprises of one or more photon sensing elements, also referred to as pixels 102, which are typically organized in a rectangular array 101 within the focal plane. The CCD 100 may be formed utilizing conventional three-phase CCD process technologies.

The CCD 100 may further include a storage area 106 where the charge that is transferred from an exposed pixel 102 can be stored in a storage pixel 107. The storage pixel 107 is not exposed to light, while pixels in the array 101 are exposed to light (or integrated) for a specified duration that is referred to as the integration time. Once the integration is complete, select and read operations take place and the charges that were produced beneath the pixels 102 within the semiconductor material are transferred in what is known as the "bucket brigade" operation. The CCD 100 undergoes a read operation by shifting rows of pixels 102 in a parallel fashion, one row at a time, to a serial shift register 103. The serial register 103 then sequentially shifts each row of image information from each pixel 107 (or 102 if there is no storage) to an output amplifier 105. The charges may be transferred first to the storage array 106 (for what is known as a Frame-Transfer CCD) if it exists and then to the serial shift register 103 or directly to the serial shift register 103 if there is no storage array 106.

The charges transfer via the serial shift register 103. After a reset operation, which discharges the sense node to a reference voltage (see FIG. 2 for further details), new charge is transferred from the serial register 103, sensed, and converted to voltage in a detection block 104. The output voltage from the detection block 104 is then amplified by an output amplifier 105 to produce an output voltage 109.

When a high frame rate is required, the pixel rate is increased, e.g., to rates above 500 kHz, causing the amplifier 105 to have increased noise bandwidth, which results in signal-to-noise ratio (SNR) degradation. In particular, this problem becomes more severe when the incoming signal is very low as the case is when detecting only a single or a few photons.

The conventional CCD 100 is either a Full-Frame type (i.e., not having the storage area 106) or a Frame-Transfer type that does have the storage area 106. However, the current invention is not limited to either of these transfer schemes and can be implemented with, and not limited to, any other transfer scheme such as Interline-Transfer (i.e., storage lines in between the exposed lines) or Split-Frame-Transfer (i.e., multiple storage areas). Further, even though the CCD 100 is described in a three-phase operation, the present invention is not limited to a three-phase scheme.

Figure 2:
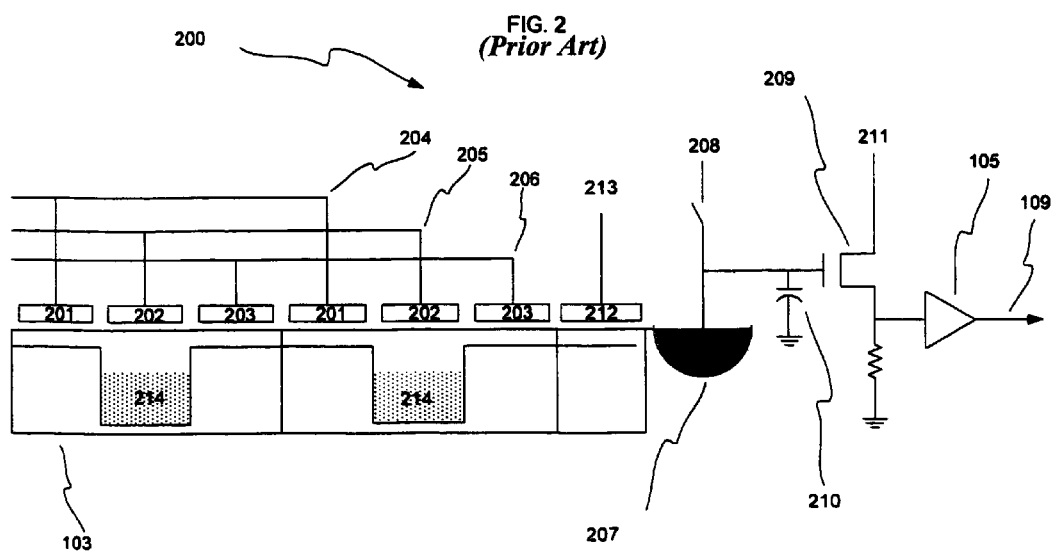
FIG. 2 is a more detailed block diagram illustrating an exemplary three-phase charge transfer technique for the CCD in FIG. 1.

FIG. 2 is a more detailed block diagram 200 illustrating an exemplary three-phase charge transfer technique, including voltage sensing and amplification, for the CCD 100. The depicted scheme is a typical three phase transfer technique for transferring the charge 214 that originally accumulated within the pixel 102. The last two cells 108 of the shift register 103 are shown with their three control gates 201, 202, and 203 coupled to corresponding clocking lines 204, 205, and 206. The three-phase charge transfer is achieved by forming a potential well (high voltage on gate clock line) or potential barrier (low voltage on gate clock line) beneath each gate.

At phase one, gates 201 and 202 have low-level voltages (forming potential barriers) and gates 203 of the cell have high-level voltages, forming potential wells that are filled with the integrated charge (electrons) 214. At phase two, gates 201 for both cells 108 are brought to a high voltage, followed shortly, but not simultaneously, by gates 203 assuming low voltages. The integrated charge 214 now resides under gates 201 of both cells. In a similar manner, the charge 214 can be further shifted to reside under gates 202 at phase three by changing the voltage applied to gates 201 and 202, to complete the cycle.

The charge 214 is then transferred to a sense node diode 207, creating a parasitic capacitance 210, followed by a charge-to-voltage amplifier 209, such as a source-follower. The output of the amplifier 209 with drain 211 is amplified by output amplifier 105, producing amplified output voltage 109. Prior to each charge transfer via the transfer gate 212 and transfer clock 213 during the read operation or readout stage, the sense node 207 is reset via a reset line 208 during the reset stage.

Figure 3A:
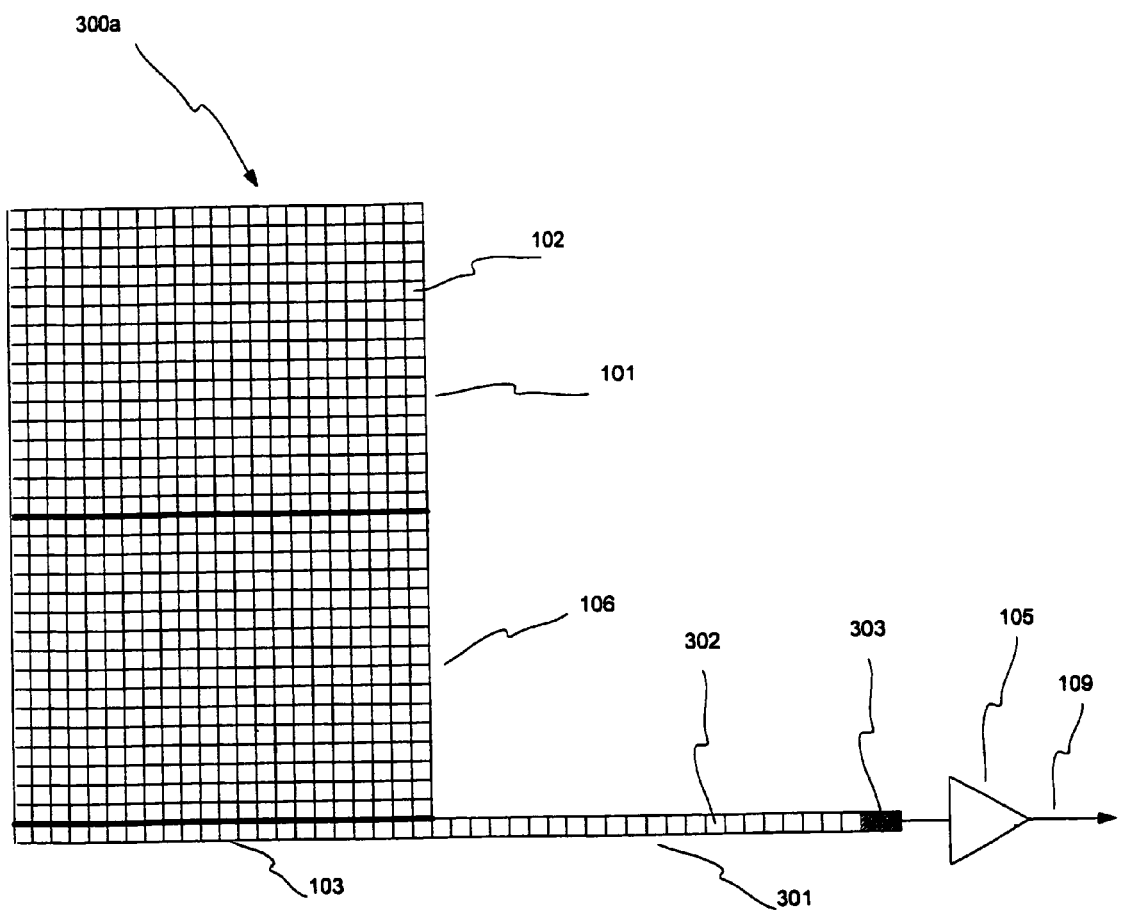
FIG. 3A is a block diagram of a conventional three-phase Charge Multiplication CCD.

As described in FIG. 1, when a high frame rate is required, the amplifier 105 has increased noise bandwidth due to the higher frequency (i.e., pixel rate) thus degrading the signal-to-noise ratio (SNR). In addition, in order to accommodate the high pixel rate, a larger amplifier is required, which increases the parasitic capacitance 210. This effectively reduces the conversion gain of the amplifier and thus further degrades the SNR of the device FIG. 3A is a block diagram of a conventional three-phase Charge Multiplication CCD 300a having an array 101 and a storage array 106, as in FIG. 1. As described above, after a CCD reset operation, photons are absorbed by the exposed array 101. Once the integration is complete, select and read operations take place, and the charges are transferred first to the storage array 106 (if it exists), and then to the serial shift register 103. From the serial shift register 103, the charge is then transferred to a gain register 301. The gain register 301 is typically of the same length as the serial shift register 103 in order to simplify timing, and is provided with sufficiently high voltage clock lines to each of its gain cell 302. Within each of the gain cell 302, additional carriers are then generated by impact ionization (also referred to as avalanche gain) due to the electric fields in the semiconductor that accelerate the charge carriers to sufficiently high velocities. Lastly, the multiplied charge is received by a sensing node 303. The output voltage from the sensing node 303 is then amplified by output amplifier 105 to produce output voltage 109.

There is a noise factor NF (typically equal to 1.414 up to 1.6) which is associated with the gain register 301 and is caused by the uncertainty in the actual gain within each gain cell 302. This noise is similar to shot noise and degrades the SNR of the device.

Furthermore, the noise factor will change as there are variations in the multiplication gain of each gain cell 302 due to variations in the high voltage clock rails and due to changes in temperature. These variations will further degrade the SNR of the device.

Figure 3B:
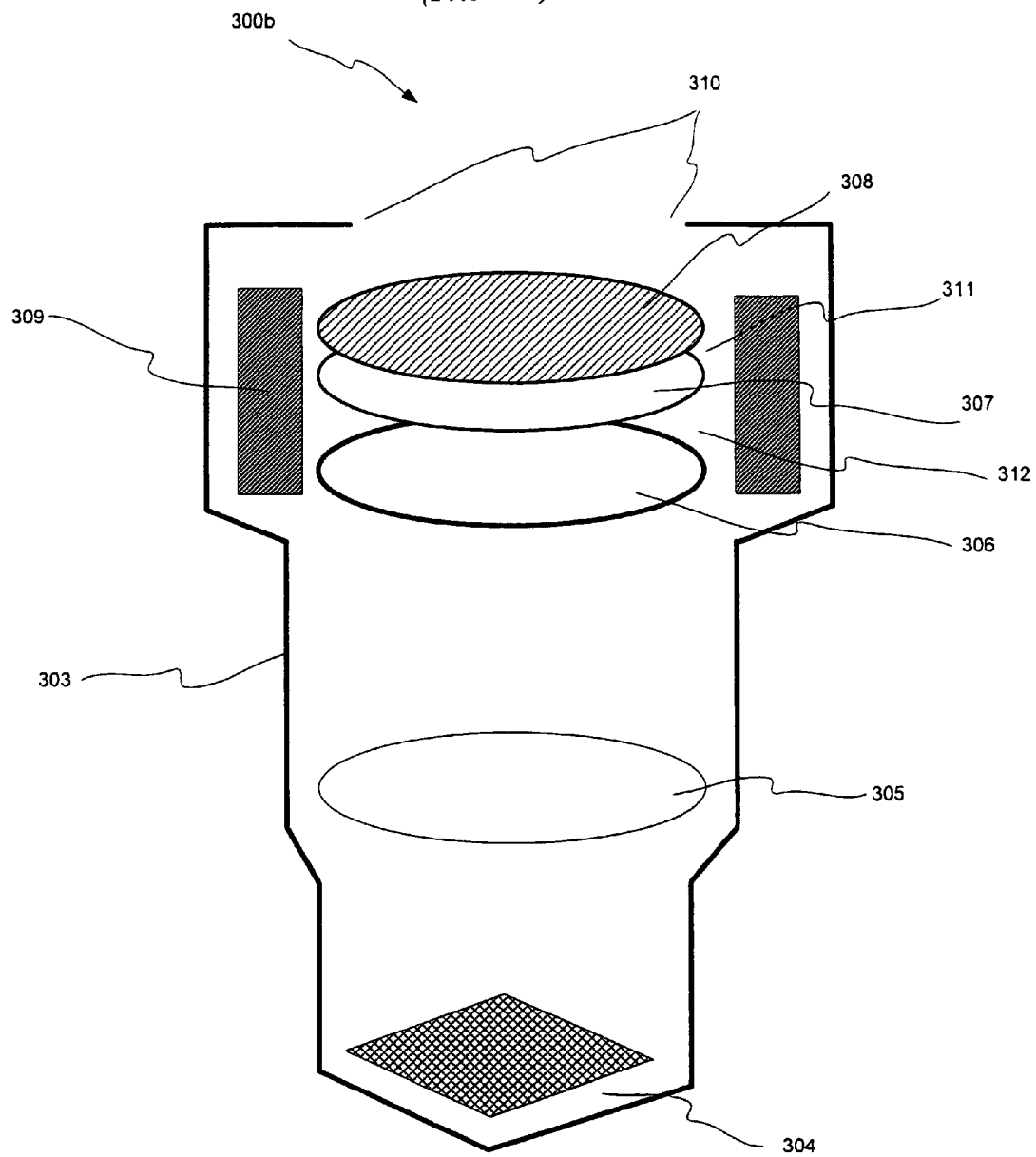
FIG. 3B is a diagram of a conventional Image Intensifier device, with an Image Intensifier tube containing a CCD.

FIG. 3B is a diagram of a conventional Image Intensifier device 300b, with an Image Intensifier tube 303 containing a conventional CCD 304. The CCD 304 integrates incoming multiplied photons through a relay lens 305 which allows for convenient interchange of the CCD sensors. The original incoming photons from the target enter the tube 303 via an opening window 310. The incoming photons are then multiplied via a multiplication block that comprises a flat photocathode 308 separated by a small gap 311 from the input side of a micro-channel plate (MCP) electron multiplier 307. The reverse side of the micro-channel plate 307 is separated from a phosphorescent output screen 306 by a small gap 312. The electrons that are released from a photocathode 308 by the incoming photons are then accelerated through the micro-channel plate 307 due to high voltages across the small gaps 311 and 312. A high voltage power supply 309 creates the high voltage across the small gaps 311 and 312. The accelerated electrons release photons from the phosphorescent screen 306 upon impact, and these photons are then sensed by the CCD 304.

Figure 4:
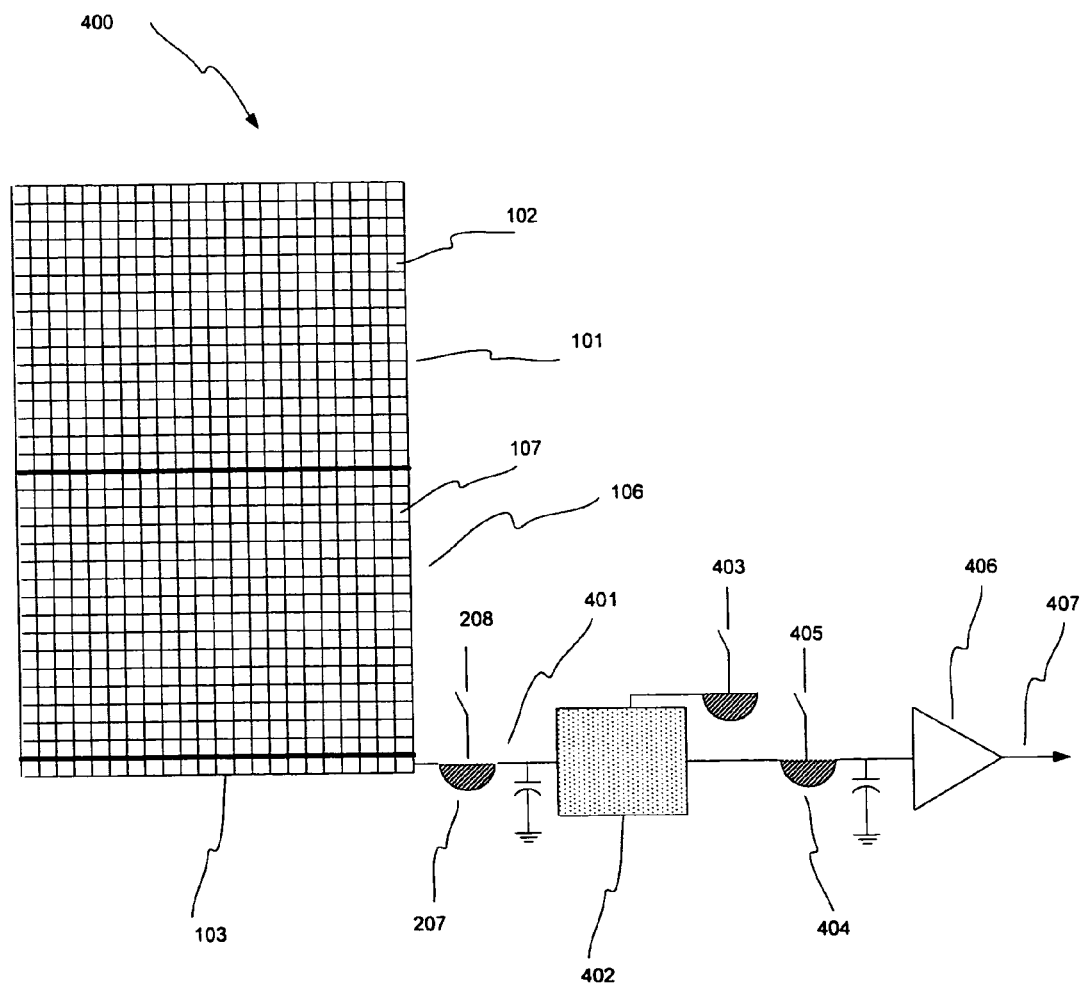
FIG. 4 is a block diagram of a low noise charge amplification CCD, according to one aspect of the present invention.

There is a noise factor NF (typically equal to 1.7) which is associated with the Image Intensifier device 300b and is the result of the uncertainty in the amount of energy that an electron that is produced by the photocathode 308 acquires when accelerated via the micro-channel plate 307. There is additional uncertainty regarding the number of photons that the electron releases from the phosphorescent screen 306. The noise is similar to shot noise and degrades the SNR of the device. Additional degradation is due to the fixed pattern noise (FPN) that is caused by the non-uniformity of the photoelectron gain from one pixel to another across the entire imaging area FIG. 4 is a block diagram of a low noise charge amplification CCD 400, according to one aspect of the present invention. The low noise charge amplification CCD 400 comprises of one or more photon sensing elements, also referred to as pixels 102, which may be organized in, but not limited to, a rectangular array 101 within the focal plane. The low noise charge amplification CCD 400 may be formed utilizing conventional three-phase CCD process technologies, although two-phase, four-phase, and any other suitable techniques and technologies may be used in the present invention. The low noise charge amplification CCD 400 may further include the storage area 106 where the charge that is transferred from an expose pixel 102 can be stored in the storage pixel 107. The storage pixel 107 is not exposed to light.

After the low noise charge amplification CCD 400 is reset, photons are absorbed by the exposed array 101 for a specified duration that is referred to as the integration time. Once the integration is complete, select and read operations take place, and the charges that were produced beneath the pixels 102 within the semiconductor material are transferred in what is known as the "bucket brigade" operation. The charges may be transferred first to the storage array 106 (if it exists), and then to the serial shift register 103. From the serial shift register 103, the charge is sensed via the sense node 207 after the sense node 207 is reset via reset line 208. The sense node 207 may be a diode. A low noise charge gain circuit 402 then receives a voltage output 401 from the sense node 207 and a charge source output via a pulsed input diode 403. The low noise charge gain circuit 402 then amplifies the charge, as will be discussed in conjunction with FIGS. 5A, 5B, 5C, 6A 6B and 7. The output from the low noise charge gain circuit 402 is then sensed, converted to a voltage, and amplified via a sense node 404 with a reset line 405 and an amplifier 406.

Figure 5A:
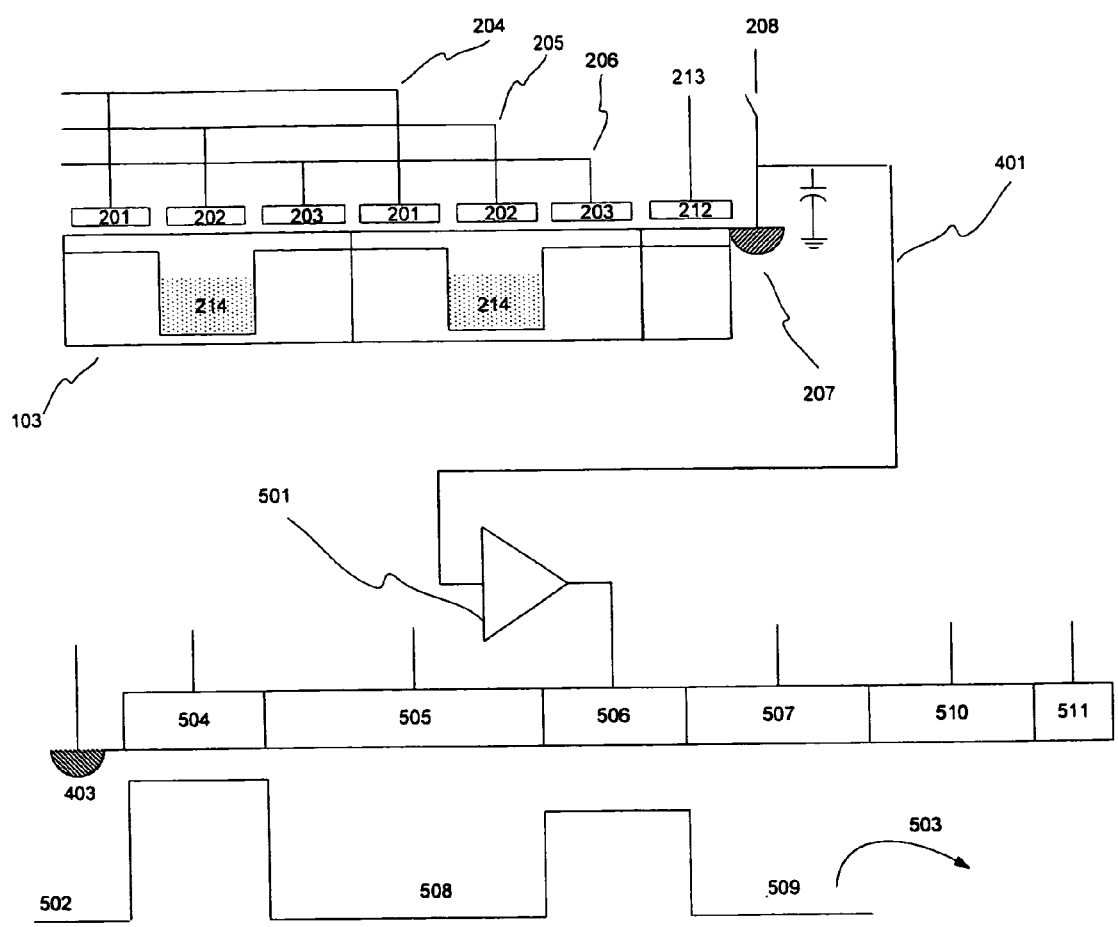
FIG. 5A is a diagram showing a portion of the CCD of FIG. 4, according to one embodiment, and in particular to one embodiment of the low noise charge gain circuit in the CCD of FIG. 4.

FIG. 5A is a diagram showing a portion of the CCD of FIG. 4, according to one embodiment, and in particular to one embodiment of the low noise charge gain circuit 402. As discussed above with respect to FIG. 2, a three-phase transfer, using three control gates 201, 202, 203, and transfer gate 212 coupled to corresponding clocking lines 204, 205, 206, and 213 and changing the voltage accordingly to the gates, charge from cell 108 of shift register 103 is transferred to sense node 207. The charge from the cell 108 of serial shift register 103 (FIG. 4) is then sensed and converted to a voltage via the sense node 207, which is and not limited to in one embodiment a diode or in a different embodiment a floating gate. Thus, the output from sense node 207 is a voltage 401 corresponding to the amount of charge transferred from the associated cell 108.

The output voltage 401 is then input to the low noise charge gain circuit 402. The low noise charge gain circuit 402 includes a high sensitivity low noise amplifier such as inverting amplifier 501 with a gain >1. The voltage 401 is input to the amplifier 501, which generates an output voltage that will be used to control the voltage on a signal gate 506. In addition to signal gate 506, the low noise charge gain circuit 402 includes a control gate 504, a reservoir gate 505, receiving gates 507 and 510, and a transfer gate 511. Note that this is for a three-phase embodiment and is not limited to such.

A voltage 502 from the pulsed input diode 403 is input to the low noise charge gain circuit 402, allowing charge to fill reservoir well 508 and receiving well 509 by applying the appropriate voltages to the reservoir gate 505 and receiving gate 507, respectively via clocking lines (not shown). The appropriate voltage range depends on the process, implant type, gate thickness and whether it is an MPP (multi-pinphase) device or not and does not limit the current invention in any way. The positive voltage on the signal gate 506 reduces the potential barrier between the reservoir well 508 and the receiving well 509 thus allowing charge to flow from the reservoir well 508 to the receiving well 509 in proportion to the original charge accumulated in the light sensing pixel 102. The amplification gain G is directly proportional to the size of the reservoir well 508 and depends on the conversion gain G1 of the first stage amplifier 501, i.e., $G=G1*Cr$, where Cr is the capacitance of the reservoir well 508.

The control gate 504 ensures that there is no charge flowing back from the reservoir well 508 to the input diode 403 and the reservoir gate 505 provides the reference voltage level. The receiving gate 510 controls the flow of charge 503 from the receiving well 509 to one or more final receiving wells (not shown). The transfer gate 511 controls the transfer of the charge from the final receiving wells to the sense node 404. An exemplary timing-diagram for the voltage changes on the gates is provided in FIG. 5C, as will be discussed below.

Figure 5B:
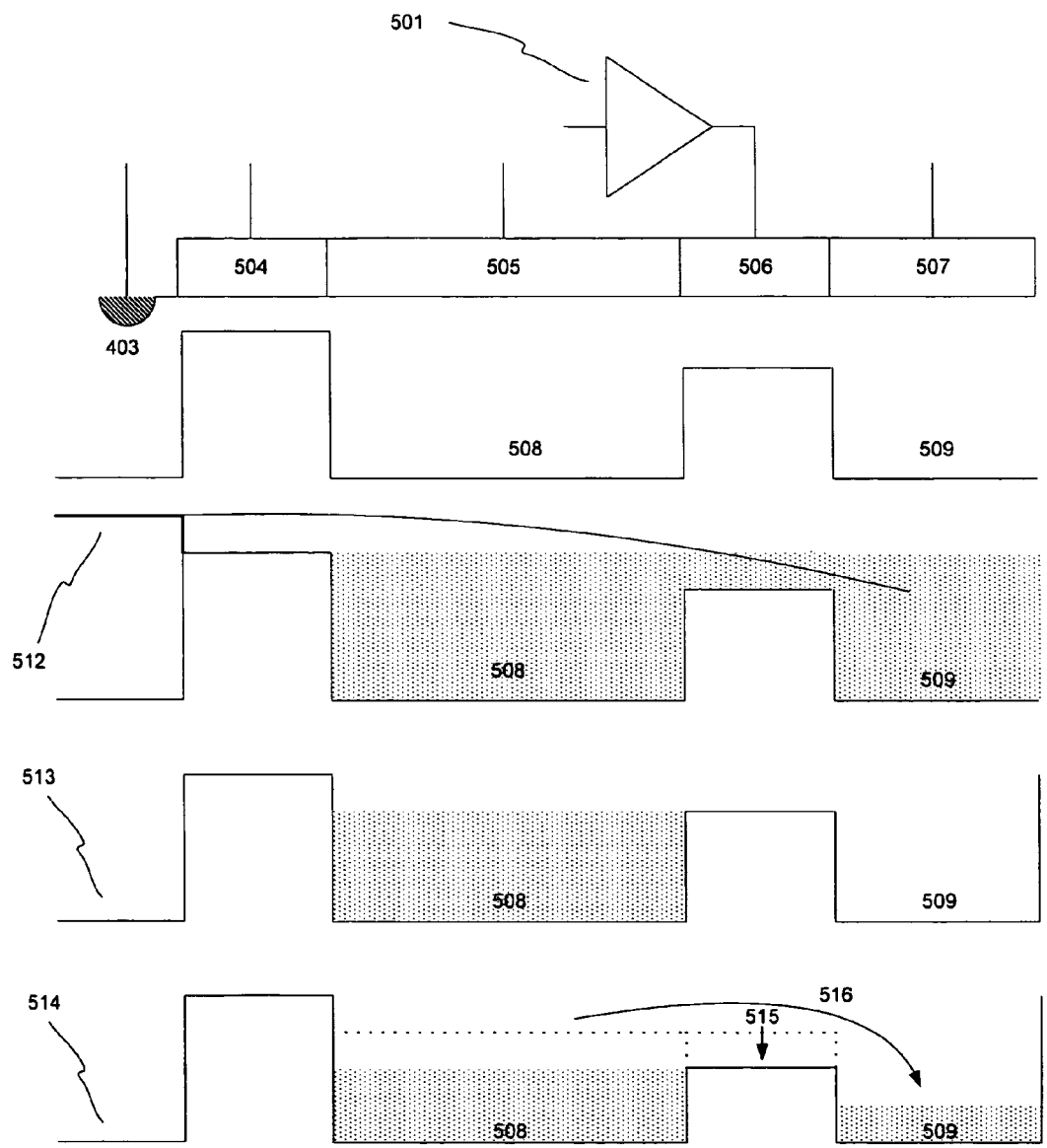
FIG. 5B is a diagram showing a charge transfer technique for the low noise charge gain circuit of FIG. 5A.

FIG. 5B is a diagram showing an exemplary charge transfer process for the low noise charge gain circuit 402. Three stages, a reset stage 512, a settling-period stage 513, and a signal-transfer stage 514 of the charge transfer are shown. At the reset stage 512, an increase in voltage on the pulsed input diode 403 allows charge to flow and accumulate in the reservoir well 508 and the receiving well 509, for example, for a small fraction of a pixel read out time which varies with pixel rate. During the settling-period stage 513, the receiving gate 507 is a potential that further allows the charge to flow out of the receiving well 509. Once the receiving well 509 is empty, voltage is applied to the receiving gate 507 such that a potential barrier is created between the receiving well 509 and the last one or more receiving wells (not shown). An appropriate voltage is then applied to the control gate 504 to ensure a potential barrier between the reservoir well 508 and the input diode 403.

At the signal-transfer stage 514, the positive voltage change $\Delta V$ 517 (See FIG. 5C) on the signal gate 506 that represents the charge accumulated by the pixel 102 reduces the potential barrier between the reservoir well 508 and the receiving well 509 by ΔV*Factor (Factor depends on process, typically ~1) 515, thus allowing a proportional charge 516 to flow from the reservoir well 508 to the receiving well 509. In the final stages (not shown), the charge will be transferred from the receiving well 509 to the sensing node 405 via one or more last receiving wells and one or more transfer gates. The charge that is transferred from the reservoir well 508 is equal to an amplification of the original charge accumulated in the pixel 102 by a gain G which is equal to G1*Cr, where G1 is the conversion gain of the first stage amplifier 501 and Cr is the capacitance of the reservoir well 508

Figure 5C:
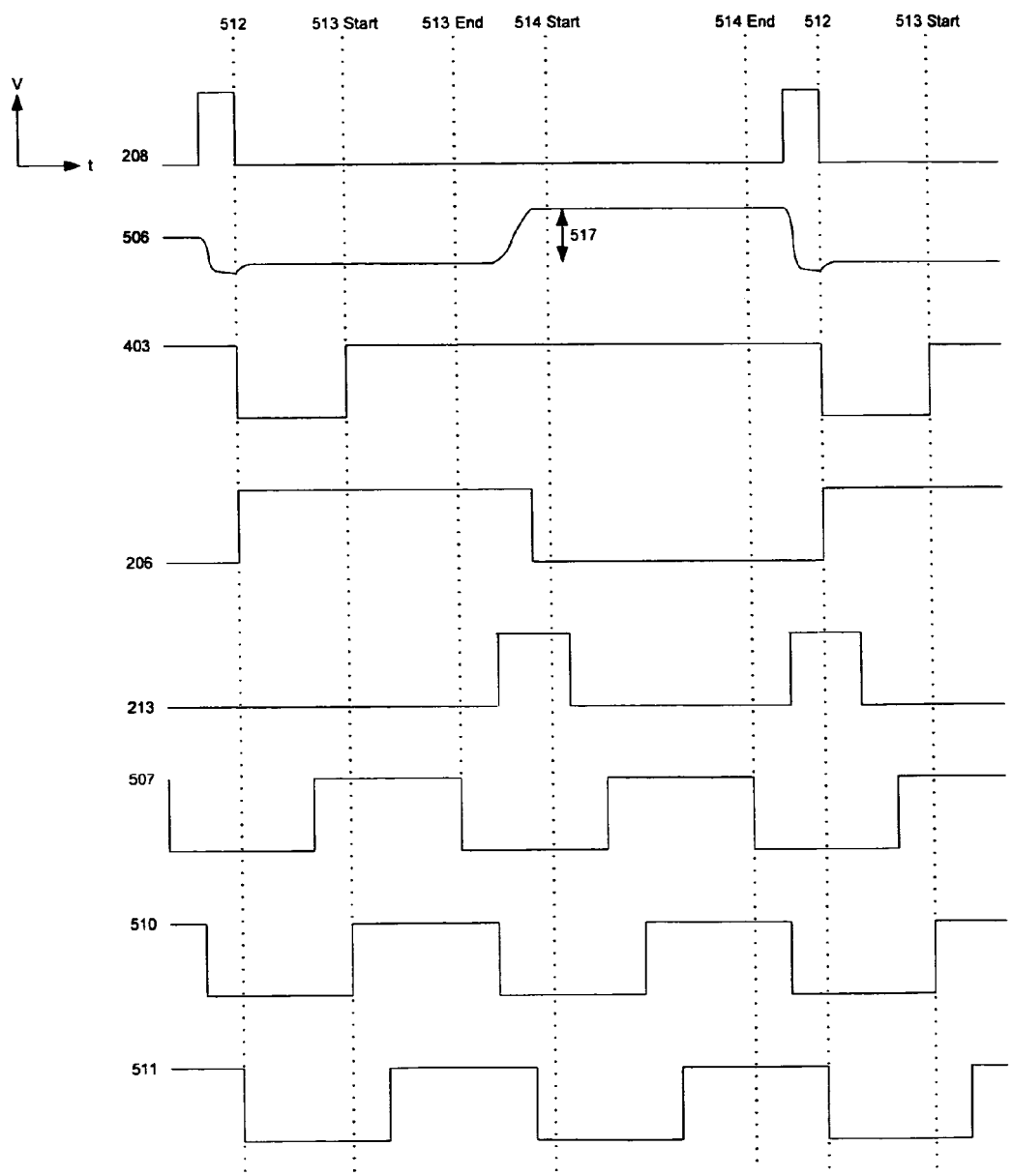
FIG. 5C is a diagram showing an exemplary timing sequence for the low noise charge gain circuit of FIG. 5A.

FIG. 5C is a diagram showing an exemplary timing sequence for the low noise charge gain circuit 402. The first stage of the low noise charge gain circuit sequence, the reset-stage 512, is triggered by the reset signal 208. The second settling-period stage allows the signal 506 to stabilize on the reset level and is triggered by the input diode 403. This stage ends when the signal 506 is stable and the receiving gate signal 507 occurs, thus allowing emptying of receiving well 509 utilizing receiving gates 507 and 510 accordingly as described in FIG. 5B. Meanwhile input clock 206 controlling gate 203 prevents charge transfer to the low noise charge gain circuit as described in FIGS. 5A and 5B. The last stage of the low noise charge gain circuit, the signal-transfer stage, is triggered by the transfer signal 213 controlling transfer gate 212 that allows charge to be sensed by the sense node 207, thus changing the voltage on gate 506 (or 505) by ΔV 517 as described in FIGS. 5A, 5B and 6A, 6B and causing the desired proportional charge spill into the receiving well 509. The change on receiving gate 507 ends the stage and further transfer of charge to final wells and output is allowed via gates 510 and 511 as described in FIGS. 5B and 6B.

Figure 6A:
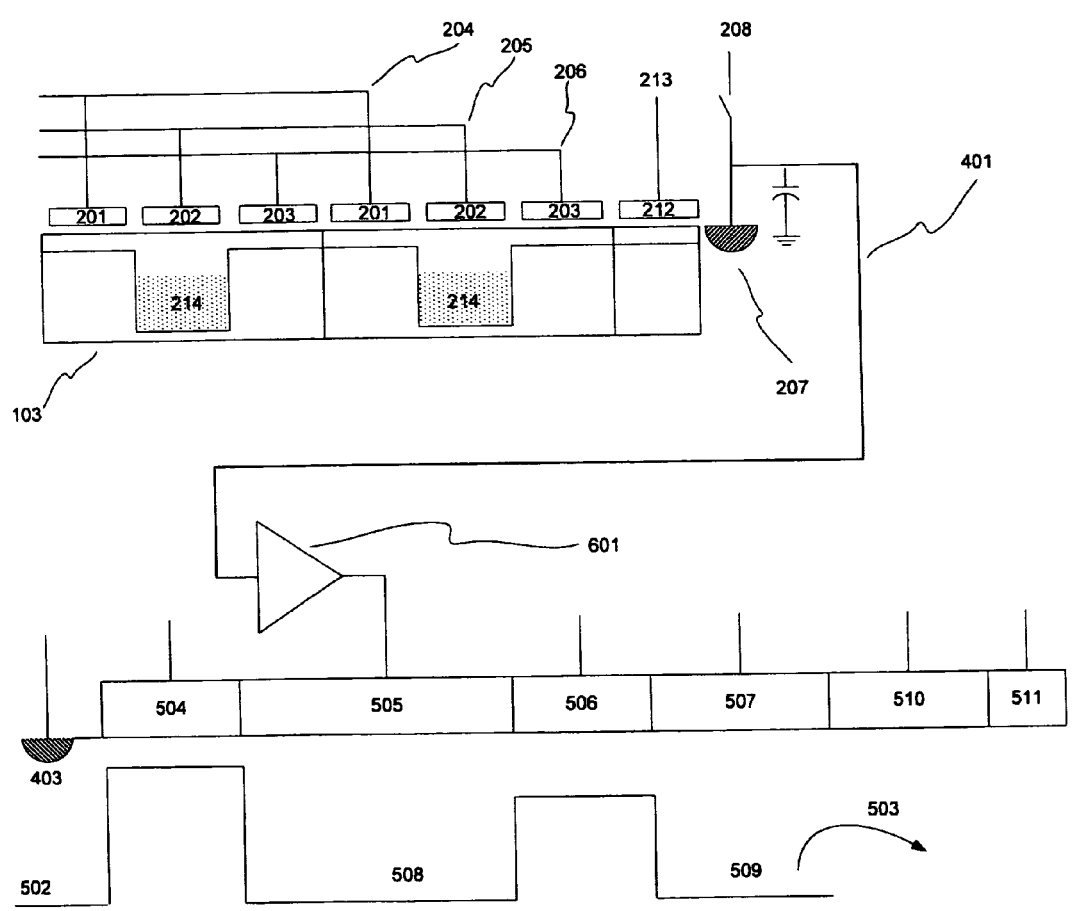
FIG. 6A is a diagram showing a portion of the CCD of FIG. 4, according to another embodiment of the present invention, and in particular to another embodiment of the low noise charge gain circuit in the CCD of FIG. 4.

FIG. 6A is a diagram showing a portion of the CCD 400 of FIG. 4, according to another embodiment of the present invention, and in particular to another embodiment of the low noise charge gain circuit 402 of FIG. 4. The low noise charge gain circuit, in this embodiment, includes a high sensitivity low noise non-inverting amplifier 601, such as source-follower with a gain <1. The input to amplifier 601 is the same as with previous embodiments, and thus will not be repeated. The amplifier 601 will convert its input to voltage corresponding to the charge in an associated pixel 102. The output voltage of amplifier 601 is coupled to reservoir gate 505 to control reservoir well 508. This is in contrast to the embodiment of FIGS. 5A and 5B, in which the amplifier is inverting and the output is coupled to signal gate 506.

The voltage 502 from the pulsed input diode 403 is input to the low noise charge gain circuit 402, allowing charge to fill reservoir well 508 and receiving well 509 by applying the appropriate voltages to the reservoir gate 505 and receiving gate 507, respectively via clocking lines (not shown). The appropriate voltage range depends on the process, implant type, gate thickness and whether it is an MPP (multi-pin-phase) device or not and does not limit the current invention in any way. The negative voltage on the reservoir gate 505 reduces the reservoir well 508 capacity and thus pushes the charged carriers above the potential barrier between the reservoir well 508 and the receiving well 509. As a result, charge flow from the reservoir well 508 and the receiving well 509 in proportion to the original charge accumulated in the light sensing pixel 102. The amplification gain G is directly proportional to the size of the reservoir well 508 and depends on the conversion gain G1 of the first stage amplifier 601, i.e., G=G1*Cr, where Cr is the capacitance of the reservoir well 508.

The control gate 504 ensures that there is no charge flowing back from the reservoir well 508 to the input diode 403 and the reservoir gate 505 provides the reference voltage level. The receiving gate 510 controls the flow of charge 503 from the receiving well 509 to one or more final receiving wells (not shown). The transfer gate 511 controls the transfer of the charge from the final receiving wells to the sense node 404. An exemplary timing-diagram for the voltage changes on the gates is provided in FIG. 5C.

Figure 6B:
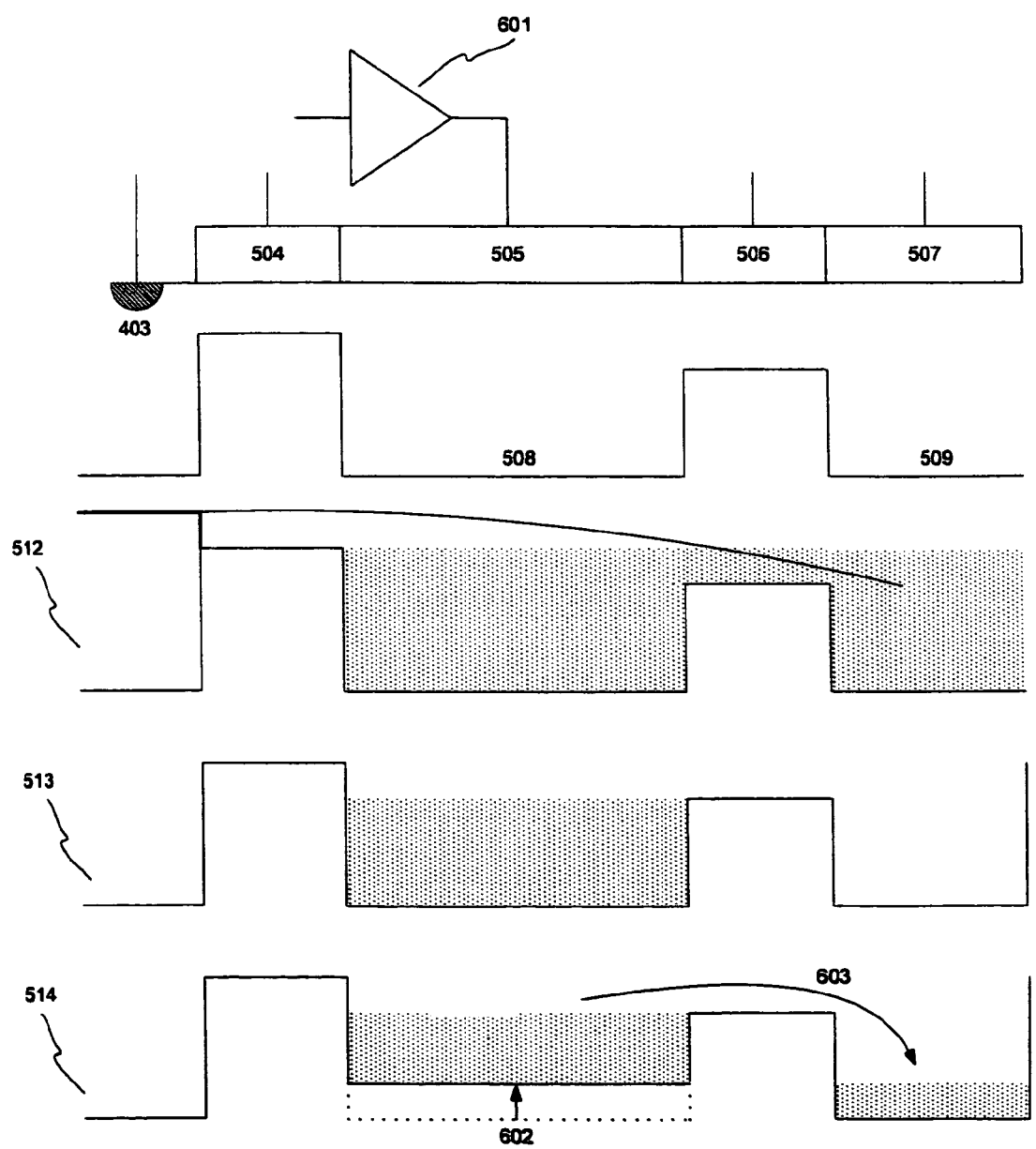
FIG. 6B is a diagram showing a charge transfer technique for the low noise charge gain circuit of FIG. 6A.

FIG. 6B is a diagram showing an exemplary three-stage charge transfer process for the low noise charge gain circuit 402 of FIG. 6A. The reset and settling-period stages in this embodiment are the same as in the example of FIG. 5B and is thus not repeated. At the signal-transfer stage 514, the negative voltage on the reservoir gate 505 that represents the charge accumulated by the pixel 102 reduces the capacity 602 of the reservoir well 508 and thus pushes the excess charged carriers 603 over the potential barrier between the reservoir well 508 and the receiving well 509. This allows proportional charge to flow from the reservoir well 508 to the receiving well 509. Charge from the receiving well 509 is then transferred to the sensing node 404 via one or more last receiving wells and one or more transfer gates, as described above.

Figure 7:
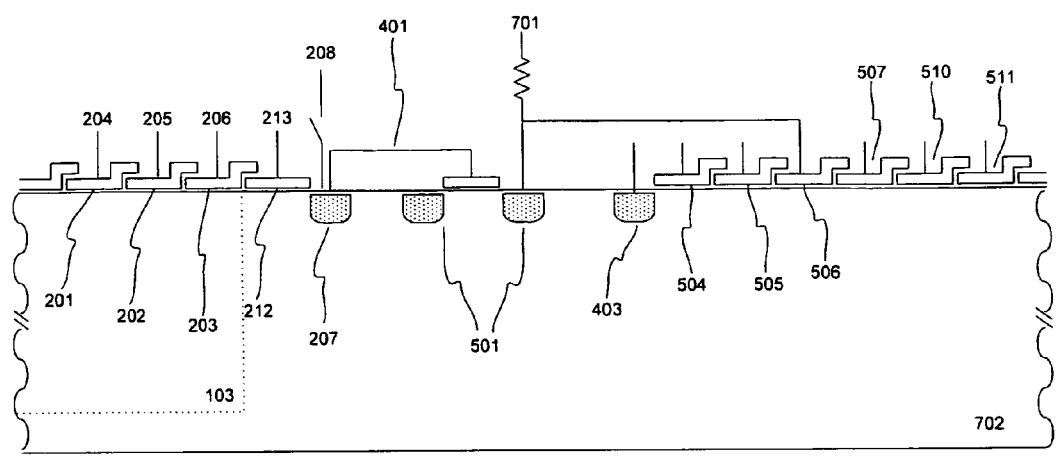
FIG. 7 is a diagram showing an exemplary physical structure of the low noise charge gain circuit of FIG. 5A.

FIG. 7 is a diagram showing a physical structure of a portion of the CCD of FIG. 4, according to one embodiment, and in particular to one embodiment of the low noise charge gain circuit of FIG. 5A. The physical structure representing the low noise charge gain circuit embodiment of FIG. 6A is identical apart than the first stage amplifier connection (not shown here) that connects to reservoir gate 505 instead of signal gate 506.

Part of a substrate 702 of the CCD of FIG. 4 is shown with gates 201, 202 and 203 of the last cell 108 of the serial shift register 103 formed on top and responsible for the creation of wells and barriers underneath for the three-phase charge transfer as described in FIG. 2. Coupled to the shift register 103 are the transfer gate 212 formed on top and the implanted sense node 207 formed in the substrate 702 where the charge is sensed, as depicted in FIG. 5A. The structure further includes the charge-to-voltage conversion amplifier 501 consisting of implanted source drain regions and gate on top and the voltage bias input 701. Finally, the low noise charge gain circuit structure is shown with its input diode 403 formed by implantation into the substrate coupled to gates 504, 505, 506, 507, 510 and 511 formed on top of the substrate 702 that create wells and barriers underneath and perform the amplification as described in FIGS. 5A and 5B. Gate 506 is connected to the output of amplifier 501 and thus allows charge to spill from the reservoir well to the receiving well in proportional amount to the charge originally sensed.

All gates shown may be separated from the substrate by a thin dielectric, typically by a thermally grown silicon dioxide. All gates may be formed from polycrystalline silicon or other conducting material with appropriate work function. The implant species can be either positive or negative donors depending on the polarity of the substrate and the design of the CCD.

Embodiments described above illustrate but do not limit the invention. It should also be understood that numerous modifications and variations are possible in accordance with the principles of the present invention. For example, embodiments of the invention have been described above with reference to CCD imagers and CCD imaging. However, the present invention may also apply to all function of CCDs, such as, but not limited to, CCDs used for analog memory, analog delay lines, and other signal processing functions. Accordingly, the scope of the invention is defined only by the following claims.

What is claimed is:

1. A charge coupled device (CCD), comprising:
   an array of cells;
   a shift register to store charge from at least one of the cells;
   a sense node to sense charge transferred from the shift register and generate a voltage output corresponding to the amount of sensed charge;
   a low noise charge gain circuit having a gain greater than 1 to receive the voltage output from the sense node and to receive charge from a charge source, the low noise charge gain circuit being adapted to amplify the charge amount dependent on the voltage output; and
   a voltage output amplifier coupled to the output of the low noise charge gain circuit.

2. The CCD of claim 1, wherein the cells are photon sensing elements.

3. The CCD of claim 2, further comprising a storage area to store charge from the photon sensing elements.

4. The CCD of claim 2, further comprising a reset line coupled to the low noise charge gain circuit.

5. The CCD of claim 2, further comprising an amplifier coupled to the output of the low noise charge gain circuit.

6. The CCD of claim 2, wherein the low noise charge gain circuit comprises a high sensitivity low noise inverting amplifier.

7. The CCD of claim 6, wherein the low noise charge gain circuit comprises a signal gate coupled to the output of the inverting amplifier.

8. The CCD of claim 6, wherein the low noise charge gain circuit comprises a control gate coupled to the charge source.

9. The CCD of claim 6, wherein the low noise charge gain circuit comprises:
   a reservoir gate;
   a receiving gate, wherein the signal gate is between the reservoir and receiving gates;
   a reservoir well associated with the reservoir gate; and
   a receiving well associated with the receiving gate.

10. The CCD of claim 9, wherein the low noise charge gain circuit further comprises a last stage receiving well coupled to the receiving well.

11. The CCD of claim 10, wherein the low noise charge gain circuit further comprises a last stage transfer gate associated with the last stage receiving well.

12. The CCD of claim 1, wherein the charge source is a pulsed input diode.

13. The CCD of claim 6, wherein the inverting amplifier has a gain greater than one.

14. The CCD of claim 1, wherein the low noise charge gain circuit comprises a high sensitivity low noise non-inverting amplifier.

15. The CCD of claim 14, wherein the non-inverting amplifier is a source-follower amplifier with a gain less than one.

16. The CCD of claim 14, wherein the low noise charge gain circuit comprises a reservoir gate coupled to the output of the non-inverting amplifier.

17. The CCD of claim 13, wherein the low noise charge gain circuit comprises a signal gate coupled to the output of the inverting amplifier.

18. The CCD of claim 14, wherein the low noise charge gain circuit comprises a control gate coupled to the output of the charge source.

19. The CCD of claim 14, wherein the low noise charge gain circuit comprises:
   a control gate coupled to the output of the charge source;
   a reservoir gate coupled to the output of the non-inverting amplifier; and
   a signal gate, wherein the reservoir gate is between the signal gate and the control gate.

20. A low noise charge gain circuit having a gain greater than one for use with a charge coupled device having an array of cells for amplifying charge accumulated in a first cell, the low noise charge gain circuit comprising:
   a semiconductor substrate;
   a charge to voltage amplifier formed in the substrate, wherein an input to the amplifier is coupled to the charge; and
   a plurality of gates formed over the substrate, wherein the gates are coupled to signals that allow the gates to form potential wells and barriers in the substrate, wherein a first one of the gates is coupled to an output of the amplifier for determining the amount of charge accumulated in an underlying well.

21. The gain circuit of claim 20, further comprising a source node implanted in the substrate, wherein the source node is coupled to the input of the amplifier.

22. The gain circuit of claim 20, wherein the first one of the gates is a signal gate.

23. The gain circuit of claim 20, wherein the first one of the gates is a reservoir gate.

24. The gain circuit of claim 20, wherein the plurality of gates include a control gate, a reservoir gate, a signal gate, a receiving gate, and a transfer gate.

* * * * *